United States Patent [19]

Dobrowolski et al.

[11] Patent Number: 5,049,780
[45] Date of Patent: Sep. 17, 1991

[54] OPTICAL INTERFERENCE, ELECTROLUMINESCENT DEVICE HAVING LOW REFLECTANCE

[75] Inventors: Jerzy A. Dobrowolski, Ottawa; Brian T. Sullivan, Gloucester; Robert C. Bajcar, Bramalea, all of Canada

[73] Assignee: National Research Council of Canada, Ottawa, Canada

[21] Appl. No.: 414,461

[22] Filed: Sep. 29, 1989

[30] Foreign Application Priority Data

Dec. 2, 1988 [CA] Canada .................................. 584863

[51] Int. Cl.$^5$ ............................ G02B 1/10; H01J 1/70; H05B 33/22
[52] U.S. Cl. .................................... 313/509; 313/506; 313/112; 359/580
[58] Field of Search ............... 313/503, 506, 509, 112; 350/163, 164, 166, 357

[56] References Cited

U.S. PATENT DOCUMENTS 4,020,389  4/1977  Dickson et al. ................. 313/112 X Primary Examiner—Donald J. Yusko
Assistant Examiner—John Giust
Attorney, Agent, or Firm—Griffin, Branigan & Butler

[57] ABSTRACT

An optical interference electroluminescent device having low reflectance comprises three layers forming an electroluminescent transparent front electrode, a counter electrode and an electroluminescent layer between the electrodes, with or without dielectric layers between them, and at least one optical interference film layer sandwiched between two of the layers or at the faces of the electrodes. The optical interference layer comprises at least one transparent optical interference film and is in interfacial contact with a layer so that the reflectance of ambient light by the device is reduced by optical interference at the interfaces between the layers and the film(s). The optical interference layer(s) may include at least one partially absorbing film. The device may have arrays of electrodes forming pixels.

15 Claims, 3 Drawing Sheets

OPTICAL INTERFERENCE, ELECTROLUMINESCENT DEVICE HAVING LOW REFLECTANCE

This invention relates to an optical interference electroluminescent device having a low reflectance.

BACKGROUND OF THE INVENTION

Electroluminescent devices typically consist of an electroluminescent layer, sometimes sandwiched between dielectrics, with electrodes attached to both sides. With the application of a voltage on the electrodes, light is emitted from the electroluminescent layer and through the electrodes, if they are transparent. When viewed under high ambient light illumination, the light that reaches the observer is composed of the emitted light and the ambient light reflected by the device. If $L_{on}$ is the emitted luminance, R is the reflectance by the device and $L_{amb}$ is the ambient illuminance, then the signal-to-reflected ambient light ratio (SRA) can be written as $$SRA = L_{on}/(R \cdot I_{amb}). \quad (1)$$

Clearly, a high SRA is desirable and under a given ambient light illumination, this can be achieved by either increasing the brightness or decreasing the reflectance of the device.

Of particular interest are the devices capable of displaying images. Electronic displays, particularly light emitting displays, are frequently limited in applications involving high ambient light levels, e.g. direct sunlight, because of their high reflectance of ambient light and, hence, the tendency of the displayed imagery to "wash-out".

An image on a display is formed using activated picture elements (ON pixels with a luminance $L_{on}$) of the display screen which have a higher luminance relative to the screen background. The screen background for a particular image is comprised of inactive pixels (OFF pixels with a luminance $L_{off}$) along with the passive elements of the display, i.e. the area between the pixels.

The legibility of a displayed image can be quantitatively defined in terms of a contrast ratio. If the reflectance of the pixels is R and the ambient illuminance is $I_{amb}$ then, if the passive elements of the display are ignored for simplicity, the contrast ratio (CR) can be written as, $$CR = (L_{on} + R \cdot I_{amb})/(L_{off} + R \cdot I_{amb}). \quad (2)$$

If the contrast ratio is less than a certain value, degraded legibility results and the display may be judged inadequate. For high ambient illumination, the contrast ratio deteriorates and CR tends to unity unless either $L_{on}$ is increased or else the reflectance of the ambient light by the pixels can be minimized.

Previous attempts to improve the contrast ratio, and hence the legibility of electronic displays, have included the use of anti-reflecting coatings on the outside of displays and auxiliary filter elements such as polarizers, band-pass filters, neutral density filters, louvred screens, plastic meshes, etc. With some of these methods, the brightness of the display has been compromised, sometimes to an unacceptable degree. Increasing the luminance of the pixels to compensate for this effect can lead to a shorter life and reliability problems.

One important electro-optical device is the electroluminescent device which has several distinguishing attributes: low power, potentially high contrast, light weight, wide viewing angle, nonlinear luminescence versus voltage characteristics important for matrix addressing, and a multi-colour capability. A typical ac electroluminescent device is composed of the electro-optical members functioning as, a) a front transparent electrode,
b) a first transparent dielectric,
c) an electroluminescent member,
d) a second dielectric and, In some cases, the dielectrics (b) and (d) are omitted allowing dc operation of the device. With the application of a voltage across the electrodes, a high electric field can be generated across the electroluminescent member which results in electroluminescence. The dielectric layers are used to limit the current in the device and prevent a catastrophic breakdown of the electroluminescent member, however, the device is then electrically a capacitor, hence, requiring an ac voltage to be applied across the electrodes. For large area displays, the counter electrode must have a low electrical resistivity, and hence, this usually requires it be made out of a metal such as aluminum. Unfortunately, this results in a device having a large reflectance in the visible portion of the optical spectrum.

One particular application of the electroluminescent device is a display in which pixels or more generally patterns, are formed when areas of the front (a) and rear (e) electrodes partially overlie one another in the viewing direction. The metal counter electrode reflects the ambient light strongly, and hence, under high ambient light illumination, results in a low contrast ratio for the display.

There is a need for an electroluminescent device wherein the contrast ratio of the device is significantly improved by the device having a low overall reflectance of the ambient light. The applicants have found that this can be accomplished according to the present invention, using the thin film phenomenon known in the art as optical interference.

Optical interference is defined as the variation of electromagnetic wave amplitude with distance or time, caused by the superposition of two or more waves of electromagnetic radiation (light). These two or more waves can be the result of reflection or transmission at the interfaces of thin film multilayer structures, used in the present invention, provided that the thicknesses of the individual films and layers are sufficient to support optical interference at the wavelengths of interest.

It has been proposed in U.S. Pat. No. 4,287,449, dated Sept. 1, 1981, "Light-Absorption Film for Rear Electrodes of Electroluminescent Display Panel", M. Takeda et al, to provide a display panel having at least one light absorbing layer placed between a rear dielectric layer and a counter electrode for absorbing ambient light transmitted through a transparent electrode. A plurality of light absorbing layers may be formed in the same arrangement. Materials useful for the light absorbing layers are $Al_2O_3$, $Al_2O_{3-x}$, Mo, Zr, Ti, Y, Ta, Ni, Al or the like with a thickness of about 10–300 Å.

Intrinsic absorption of light is defined as the process whereby some of the energy of electromagnetic radiation (light) is transferred to a substance on which it is incident or which it traverses. It is possible to significantly enhance the amount of absorption of light in a thin film multilayer structure, through the phenomenon of optical interference, over that of intrinsic absorption along provided, that as stated above, the thickness of the individual films and layers are sufficient to support optical interference at the wavelengths of interest. This phenomenon is hereinafter referred to optical interference enhanced absorption.

The Takeda et al devices, while useful, are primarily concerned with intrinsic absorption alone of the ambient light because the layers are of thickness which are not capable of minimizing reflectance of light by optical interference enhanced absorption.

SUMMARY OF THE INVENTION

According to the present invention there is provided an optical interference, electroluminescent device having low reflectance, comprising;

a) an electroluminescence transmitting front electrode electro-optical member, comprising at least one layer, b) a counter electrode electro-optical member, comprising at least one layer, to the rear side of the front electrode electro-optical member, c) an electroluminescent electro-optical member, comprising at least one layer, between the front electrode electro-optical member and the counter electrode electro-optical member, and d) for at least one of the electro-optical members, an optical member in interfacial contact therewith, the optical member comprising at least one optical interference film which is substantially transparent to ambient light, whereby the spectral reflectance of the device is modified by the thickness and material of the said at least one film being chosen for the thicknesses and materials of the electro-optical members, such that the reflectance of ambient light by all of the electro-optical members of the device towards the viewer is reduced by optical interference of light partially reflected at the interfaces of the said at least one film in combination with that of light partially reflected at interfaces of the layers of the electro-optical members.

The said at least one optical member may comprise at least one further film which is partially absorbing with respect to visible light, so that the spectral reflectance and absorptance of the device are modified by the thicknesses and materials of the substantially transparent and partially absorbing films of that optical member in combination with the thicknesses and materials of the electro-optical members, so that the reflectance of ambient light by the device towards the viewer is further reduced by optical interference enhanced absorption of light caused by the said at least one further film.

Thus, in contrast to Takeda et al, the applicants' invention uses optical interference, and if desired, optical interference enhanced absorption to achieve low reflectance.

The device may further comprise;

a) a first dielectric, electroluminescence transmitting, electro-optical member, comprising at least one layer, between the front electrode electro-optical member and the electroluminescent electro-optical member, and b) a second dielectric, electroluminescence transmitting electro-optical member, comprising at least one layer, between the counter electrode electro-optical member and the electroluminescent electro-optical member, and in these embodiments.

c) the said at least one of the electro-optical members includes the first and second dielectric electro-optical members.

The thicknesses and materials of the layers of the electro-optical members in the device may be chosen to further reduce the reflectance of the device by optical interference.

When the said at least one optical member includes a partially absorbing film, a) the counter electrode electro-optical member may have high reflectance, and b) the said at least one of the optical members may be in interfacial contact with the front face of the counter electrode electro-optical member, so that the reflectance of light from the counter-electrode electro-optical member is reduced throughout the visible spectrum, including the wavelengths at which the electroluminescence is emitted, by the process of optical interference enhanced absorption.

In other embodiments where the said at least one optical member includes a partially absorbing film, a) the counter electrode electro-optical member has low reflectance and high transmittance at the wavelengths in which the electroluminescence is emitted, and b) the said at least one of the optical members is in interfacial contact with the rear face of the counter electrode electro-optical member, and c) the substantially transparent and partially absorbing films of the optical member are of such thicknesses and materials that, at the wavelengths at which the electroluminescence is emitted, the reflectance is high to increase the brightness of the device, while at other wavelengths the absorptance of light is high to reduce the reflectance of ambient light of the device towards the viewer at these other wavelengths.

In yet other embodiments where the said at least one optical member includes a partially absorbing film, a) the counter electrode electro-optical member has high reflectance, and b) the said at least one of the optical members is in interfacial contact with the front face of one of the electro-optical members, and c) the substantially transparent and partially absorbing films of that optical member are of such thicknesses and materials that, at the wavelengths at which the electroluminescence is emitted, the transmittance through that optical member is high, while at other wavelengths the absorptance of light is high to reduce the reflectance of ambient light of the device towards the viewer at these other wavelengths.

In yet other embodiments of the present invention, the front and counter electrode electro-optical members each comprise one of a plurality of electrode electro-optical members, with the front electrode electro-optical members partially overlying areas of the counter electrode electro-optical members to form a display depicting device.

When composed of a plurality of electrode electro-optical members, the front and counter electrode electro-optical members may form the grid system of a pixel display depicting device.

Further, when a plurality of the electrode electro-optical members are present, the thicknesses and materials of the films and layers at areas of different overlays may be such that, by the process of optical interference, different overlay areas of the device have substantially the same reflectance and transmittance so that a substantially uniform appearance of the display is viewed when no electroluminescence is being emitted.

The said at least one optical film which is substantially transparent may have an optical thickness, defined to be the product of refractive index and metric thickness, of at least about 0.035 μm with an extinction coefficient such that at least about 90% of the incident light is transmitted per se at a predetermined wavelength.

The said at least one further optical film which is partially absorbing may have a transmittance per se of at least about 35% at a predetermined wavelength.

Thus the present invention provides an optical interference, electroluminescent device having low reflectance, which contains at least one optical member comprising at least one film whose material and thickness are compatible with the proper electro-optical operation of the device and are such as to support the known process of thin film optical interference phenomena. There may be additional films in the optical member that are not required for optical interference but which enhance the compatibility of the optical member with the electro-optical member in interfacial contact therewith. The materials and thicknesses of the layers of the electro-optical members may be selected to yield low reflectance of the ambient light from the complete device. Furthermore, the materials and thicknesses of each film in an optical member may be such that the optical member can either minimize the reflection of ambient light at the front interface of the electro-optical component interfacing therewith or minimize the total reflection of ambient light from the complete device. By using the optical members in interfacial contact with the electro-optical members a better performance, i.e. lower reflectance, can be achieved and more relaxed requirements on the layers of the electro-optical members can be obtained.

Tests to verify the present invention have shown that the incorporation of optical members in the design of electroluminescent display devices can significantly improve the contrast ratio (CR) and legibility characteristics of the display in the presence of sunlight. Tests to verify the present invention have also shown that optical members for use in electroluminescent devices can be readily designed and fabricated for ambient light absorption, transmission or reflection over a wide range of spectral bandwidths and angles of incidence, depending on the needs of the particular device.

BRIEF DESCRIPTION OF THE DRAWINGS

In the accompanying drawings which illustrate, by way of example, embodiments of the present invention.

DETAILED DESCRIPTION OF THE INVENTION

Figure 1:
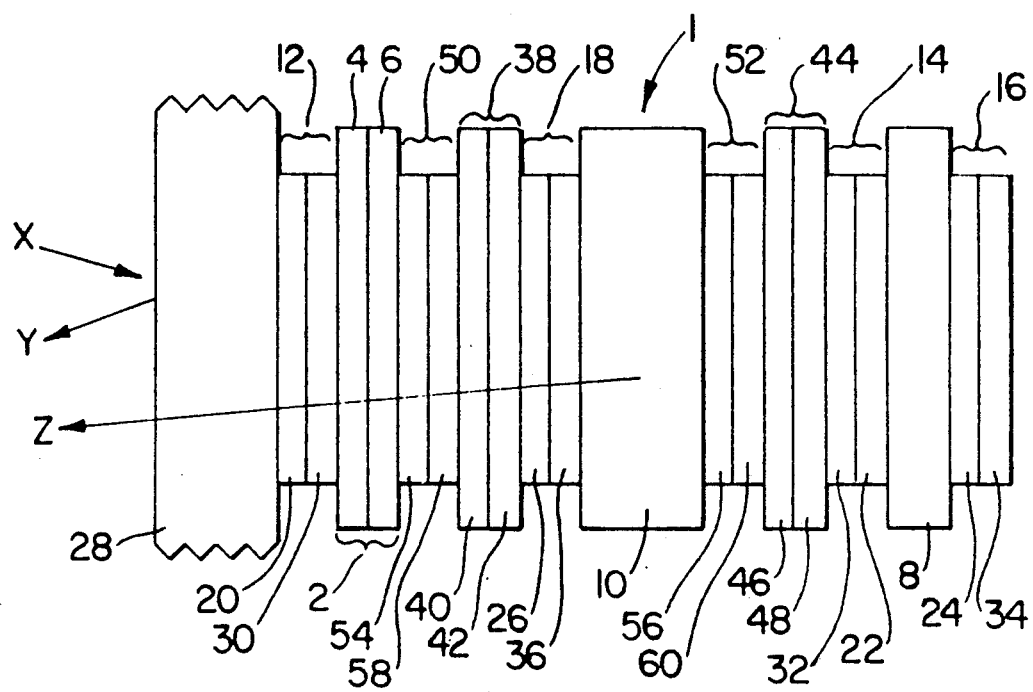
FIG. 1 is an enlarged, diagrammatic end view of an optical interference, electroluminescent device having low reflectance.

Referring to FIG. 1, there is shown an optical interference, electroluminescent device, generally designated 1, having low reflectance, comprising:

a) an electroluminescence transmitting front electrode, electro-optical member 2, comprising in this embodiment two layers 4 and 6, b) a counter electrode, electro-optical member 8, comprising one layer, to the rear side of the front electrode electro-optical member 2, c) an electroluminescent, electro-optical member 10, comprising one layer, between the front electrode electro-optical member 2 and the counter electrode electro-optical member 8, and d) for at least one of the electro-optical members 2, 8 and 10, an optical member, in this embodiment optical members 12, 14, 16 and 18, in interfacial contact therewith, the optical members 12, 14, 16 and 18 each comprising at least one optical interference film 20, 22, 24 and 26 respectively, which is substantially transparent to ambient light, whereby the spectral reflectance of the device is modified by the thicknesses and materials of the films 20, 22, 24 and 26 being chosen for the thicknesses and materials of the electro-optical members 2, 8 and 10, such that the reflectance of ambient light X by the device 1 towards the viewer in, for example, directions Y and Z, is reduced by optical interference of light partially reflected at the interfaces of each of the films 20, 22, 24 and 26 in combination with that of light partially reflected at interfaces of the layers of the electro-optical members 2, 8 and 10.

In this embodiment the electro-optical members 2, 8 and 10 and the optical members 12, 14, 16 and 18 are coatings on a glass substrate 28.

The layers 4 and 6 of the front electrode electro-optical member 2 may be a transparent layer of indium tin oxide (ITO) and gold.

The counter electrode electro-optical member 8 may be of aluminum.

The electroluminescent electro-optical member 10 may be of ZnS:Mn.

The substantially transparent optical interference films 20, 22, 24 and 26 of the optical members 12, 14, 16 and 18 may be substantially transparent films of $Al_2O_3$, $SiO_2$, $ZrO_2$, $HfO_2$, $Sc_2O_3$, $TiO_2$, ITO, $La_2O_3$, MgO, $Ta_2O_5$, $ThO_2$, $Y_2O_3$, $CeO_2$, $AlF_3$, $CeF_3$, $Na_3AlF_6$, $LaF_3$, $MgF_2$, $ThF_4$, ZnS, $Sb_2O_3$, $Bi_2O_3$, $PbF_2$, $NdF_3$, $Nd_2O_3$, $Pr_6O_{11}$, SiO, NaF, ZnO, LiF, $GdO_3$ or of another suitable thin film materials known to those skilled in the art. The optical thickness of the substantially transparent films, defined to be the product of refractive index and metric thickness, should preferably be at least about 0.035 μm with an extinction coefficient such that preferably at least about 90% of the incident light is transmitted per se at a predetermined wavelength.

In some embodiments of the present invention at least one of the optical members 12, 14, 16 and 18 comprise at least one further film 30, 32, 34 and 36 respectively, which is partially absorbing with respect to visible light, whereby the spectral reflectance and absorptance of the device 1 are modified by the thicknesses and materials of the substantially transparent and partially absorbing films, 20, 22, 24 26 and 30, 32, 34, 36 respectively, of the optical members 12, 14, 16 and 81 respectively, in combination with the thicknesses and materials of the layers of the electro-optical members 2, 8 and 10, such that the reflectance of ambient light X by the device towards the viewer in, for example, directions Y and Z, is further reduced by optical interference absorption of light caused by the further partially absorbing films 30, 32, 34 and 36.

The partially light absorbing films 30, 32, 34 and 36 may, for example, be of Al, Cu, Au, Mo, Ni, Pt, Rh, Ag, W, Cr, Co, Fe, Ge, Hf, Nb, Pd, Re, V, Si, Se, Ta, Y, Zr, as well as alloys of these metals such as Inconel, Nichrome and the like, or any absorbing oxides of these metals or their alloys thereof. For partially absorbing films, the extinction coefficient and thickness of the film should be such that the transmission through the film of the predetermined wavelength, neglecting optical interference, should preferably be at least about 35%.

The device 1 described so far is particularly suitable with a dc voltage applied between the electrode electro-optical members 2 and To stabilize the electroluminescent electro-optical member 10 against electrical breakdown, the device 1 may further comprise;

a) a first dielectric electro-optical member 38, comprising at least one layer, in the embodiment two layers 40 and 42, between the front electrode electro-optical member 2 and the electroluminescent electro-optical member 10, and b) a second dielectric electro-optical member 44, comprising at least one layer, in this embodiment two layers 46 and 48, between the counter electrode electro-optical member 8 and the electroluminescent electro-optical member 10, and c) for at least one of the electro-optical members 2, 8, 10, 38 and 44 one of the optical members 12, 14, 16, 18, 50 and 52 may be provided. That is, the first and second dielectric electro-optical members 38 and 44, when included, may be provided with at least one of the optical members 50 and 52, comprising films 54 and 56 which are substantially transparent and, if desired, films 58 and 60 which are partially absorbing with respect to visible light. The optical members 50 and 52 are in interfacial contact with the first and second dielectric electro-optical members 38 and 44, respectively. The spectral reflectance of the device is modified by the thicknesses and materials of each of the films 20, 22, 24, 26, 30, 32, 34, 36, 54, 56, 58 and 60, being chosen for the thicknesses and materials of the electro-optical members 2, 8, 10, 38 and 44 such that the reflectance of ambient light X by the device 1 towards the viewer in, for example, directions Y and Z, is reduced by optical interference of light partially reflected at the interfaces of any of the films 20, 22 24, 26, 30, 32, 34, 36, 54, 56, 58 and 60 present, in combination with that of light partially reflected at interfaces of the layers of the electro-optical members 2, 8, 10, 38 and 44. To operate the device with the dielectric electro-optical members 38 and 44 present, an ac voltage is applied across the electrode electro-optical members 2 and 8.

In some embodiments of the present invention, the thicknesses and materials of the layers of the electro-optical members 2, 8, 10 and, if present; 38 and 44, are chosen to further reduce the reflectance of the device 1 by optical interference.

In other embodiments of the present invention, when the optical member 14 includes a partially absorbing film 32.

a) the counter electrode electro-optical member 8 may have high reflectance, and b) at least the optical member 14 is present, which is in interfacial contact with the front face of the counter electrode electro-optical member 8, the optical member 14 being such that the reflectance of light from the counter electrode electro-optical member 8 is reduced throughout the visible spectrum, including the wavelengths at which the electroluminescence is emitted, by the process of optical interference enhanced absorption.

It will be self-evident to persons skilled in the art that it is within the scope of the present invention for thickness and material of the or each layer of at least one of the members 2, 12, 18, 38, and 50 to be chosen so that the output of light to the viewer from the electro-optical member 10 is maximized by optical interference as previously described.

In the following Table I, details of specific examples of devices according to the present invention are given together with those of a comparable known device.

In Table I, three devices are shown as Systems a, b and c. System a corresponds to the prior art, a known device comprised of five electro-optical members 2, 8, 10, 38, and 44 deposited on a glass substrate 28 in the sequential order shown in Table I. The materials and metric thicknesses of the electro-optical members 2, 8, 10, 38, and 44 are also shown in Table I, and are typically those used in the prior art. System b is a specific example of the embodiment of the present invention wherein the optical member 14 is comprised of substantially transparent films, 22, of $ZrO_2$ and partially absorbing films, 32, of Inconel, and the optical member 14 is in interfacial contact with the front face of the counter electrode electro-optical member 8 which is aluminum and has a high reflectance. The materials and thicknesses of the films in the optical member 14, shown in Table I for System b, have been chosen such that the reflectance of light from the counter electrode electro-optical member 8 is reduced throughout the visible spectrum, including the wavelengths at which the electroluminescence is emitted. System c is a specific example of the embodiment of the present invention wherein the thicknesses and materials of the layers of the electro-optical members 2, 8, 10, 38 and 44, shown in Table I, were chosen along with the films of the optical member 14, to further reduce the reflectance of device 1 by optical interference.

TABLE I

| Member (FIG. 1) | Deposition Sequence | Material | Film and Layer Thickness ($\mu$m) | | |
|---|---|---|---|---|---|
| | | | System a | System b | System c |
| 28 | Substrate | Glass | 2 mm | 2 mm | 2 mm |
| 2 | 1 | ITO | 0.2000 | 0.2000 | 0.1163 |
| 38 | 2 | $Y_2O_3$ | 0.3000 | 0.3000 | 0.2567 |
| 10 | 3 | ZnS:Mn | 0.6000 | 0.6000 | 0.4690 |
| 44 | 4 | $Y_2O_3$ | 0.3000 | 0.3000 | 0.1690 |
| 14 | 5 | Inconel | — | 0.0013 | 0.0013 |
| | 6 | $ZrO_2$ | — | 0.0510 | 0.0338 |
| | 7 | Inconel | — | 0.0119 | 0.0098 |
| | 8 | $ZrO_2$ | — | 0.0521 | 0.0519 |
| 8 | 9 | Al | opaque | opaque | opaque |
| | Luminous Reflectance | | 83.6% | 3.1% | 1.8% |

Figure 2:
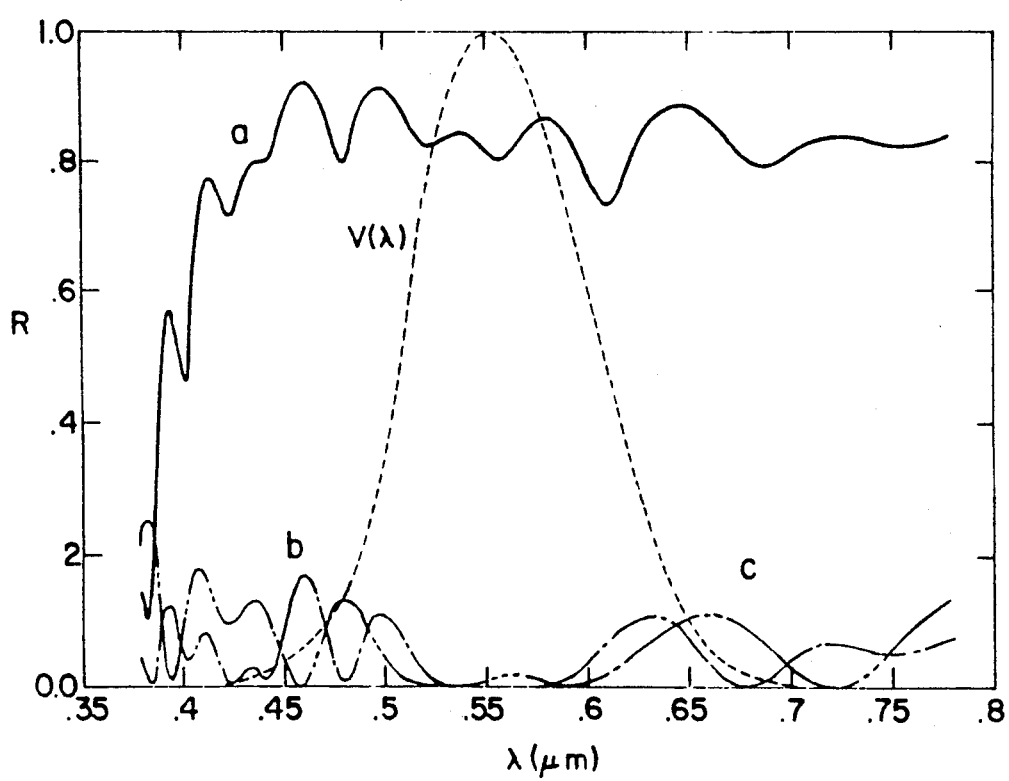
FIG. 2 is a graph in which the spectral reflectance of a known device is compared with the spectral reflectance of two embodiments of the device shown in FIG. 1.

The spectral reflectances (R) of the devices given in Table I are shown in FIG. 2, together with V(λ), the standard photopic observer curve. In FIG. 2, (- - - -) designates System a, (———) designates System B, and (— - - —) designates System c.

The luminous reflectance shown in Table I for each for the three systems is defined as the integrated product of V(λ) with the reflectance R(λ) of a system divided by the integral of V(λ). As seen in Table I, the luminous reflectance decreases from 83.6% for System a to 3.1% for System b. Choosing the thicknesses of the layers of the electro-optical members 2, 8, 10, 38, and 44 and the films of the optical member 14, System c, further reduces the luminous reflectance to 1.8%. Thus there is a substantial reduction in the reflectance of the devices in the present invention compared to the prior art.

The optical member 14 in System b allows the reflectance of light from the counter electrode electro-optical member 8 to be reduced by the previously defined process of optical interference enhanced absorption. Light incident upon the partially absorbing Inconel films 32 is partially reflected, absorbed or transmitted. The light that is transmitted through the Inconel films 32 is primarily reflected back towards the viewer by the counter electrode electro-optical member 8. As well, this light is also partially reflected back again to the aluminum layer 8 by the Inconel films 32. By choosing the thicknesses of the films 22 and 32 in the optical member 14 properly, the light reflected towards the viewer from the counter electrode member 8 is then out of phase with the light partially reflected back towards the viewer from the Inconel layers 32, and hence the light reflected towards the viewer from both the Inconel films 32 and the aluminum layer 8 destructively interfere and cancel out. The overall effect is that a substantial amount of the light incident upon the device 1 is trapped between the Inconel films 32 and the aluminum layer 8, and is reflected back and forth between these films 32 and aluminum layer 8 until the trapped light has been completely absorbed in the partially absorbing films 32 and the counter electrode electro-optical member 8.

Numerical calculations were performed to determine the difference between intrinsic absorption and optical interference enhanced absorption in the partially absorbing films 32. For System b, if the substantially transparent films 22 were not present, the total absorption of light by the partially absorbing films 32 would be 65% at the wavelength of 0.550 μm. With the substantially transparent films 22 present, as in System b, optical interference enhances the absorption so that the total absorption of light by the partially absorbing films 32 is 95% at a wavelength of 550 μm, with 4% of the incident light being absorbed by the aluminum layer 8 and less than 1% being reflected from the device 1 back to the viewer.

Figure 3:
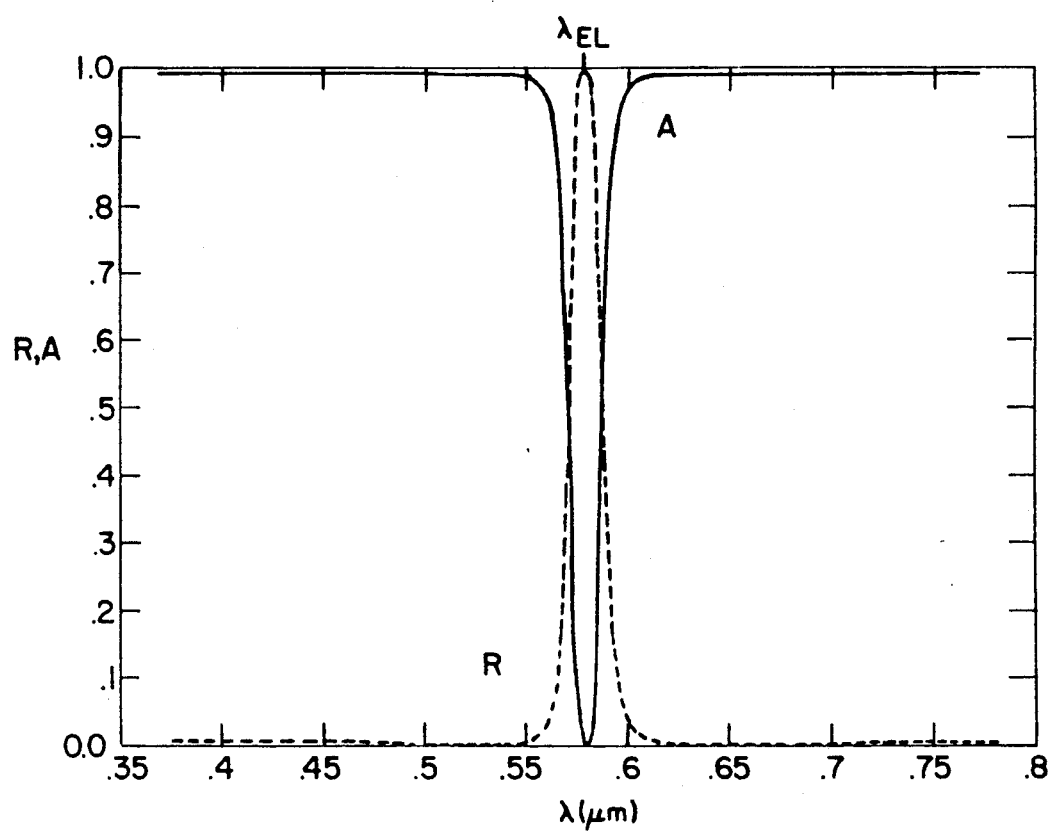
FIG. 3 is a graph of the spectral reflectance and absorptance of an optical interference electroluminescent device which behaves as a wideband absorber with narrowband reflection at the electroluminescent wavelengths.

In yet other embodiments of the present invention where the optical member 16 includes a partially absorbing film 34.

a) the counter electrode electro-optical member 8 has low reflectance and high transmittance at the wavelengths in which the electroluminescence is emitted, and b) at least the optical member 16 is present which is in interfacial contact with the rear race of the counter electrode electro-optical member 8, and c) the substantially transparent and partially absorbing films 24 and 34, respectively, of the optical member 16 are of such thicknesses and materials that, at the wavelengths at which the electroluminescence is emitted, the reflectance is high to increase the brightness of the device, while at other wavelengths the absorptance of light is high to reduce the reflectance of ambient light of the device 1 towards the viewer at these other wavelengths. The theoretical reflectance and absorptance of this embodiment according to the present invention is shown in FIG. 3, where the device behaves as a wideband absorber with narrowband reflection at an electroluminescence wavelength $\lambda_{EL}$. In FIG. 3, (———) designates the absorptance (A) of the device while (- - - - - - -) designates the reflectance (R) of the device.

In one specific example of this embodiment the optical member 16 is a quarter-wave stack (HL)$^N$HS, where H is a substantially transparent film 24 with a quarter wave optical thickness at $\lambda_{EL}$ and with a high refractive index $n_H$, L is a substantially transparent film 24 with a quarter wave optical thickness at $\lambda_{EL}$ and with a low refractive index $n_L$, and S represents a stack of substantially transparent and partially absorbing films 24 and 34, respectively, with a wideband absorptance across the visible light spectrum. The half-width of the reflectance peak at $\lambda_{EL}$ is determined by the ratio $r = (n_H/n_L)$, where as r approaches 1, the half-width decreases. The maximum reflectance at $\lambda_{EL}$ is determined by the number of periods in the quarter-wave stack, N, and this maximum reflectance increases as N increases. The half-width and maximum reflectance of the peak at $\lambda_{EL}$ can be determined by formulas given by, for example, J. A. Dobrowolski in the Hnadbook of Optics, edited by Walter G. Driscoll, McGraw-Hill Book Co., New York, 1978.

In some embodiments of the present invention, a) the counter electrode electro-optical member 8 has high reflectance, and b) the said at least one of the optical members is in interfacial contact with the front of one of the electro-optical members 2, 8, 10, 38 and 44, and c) the substantially transparent (20, 22, 26, 54, and 56) and partially absorbing (30, 32, 36, 58, and 60) films of any of the optical members 12, 14, 18, 50 and 52 present, are of such thicknesses and materials that, at the wavelengths at which the electroluminescence is emitted, the transmittance through that optical member is high, while at other wavelengths the absorptance of light is high to reduce the reflectance of ambient light of the device towards the viewer at these other wavelengths.

Figure 4:
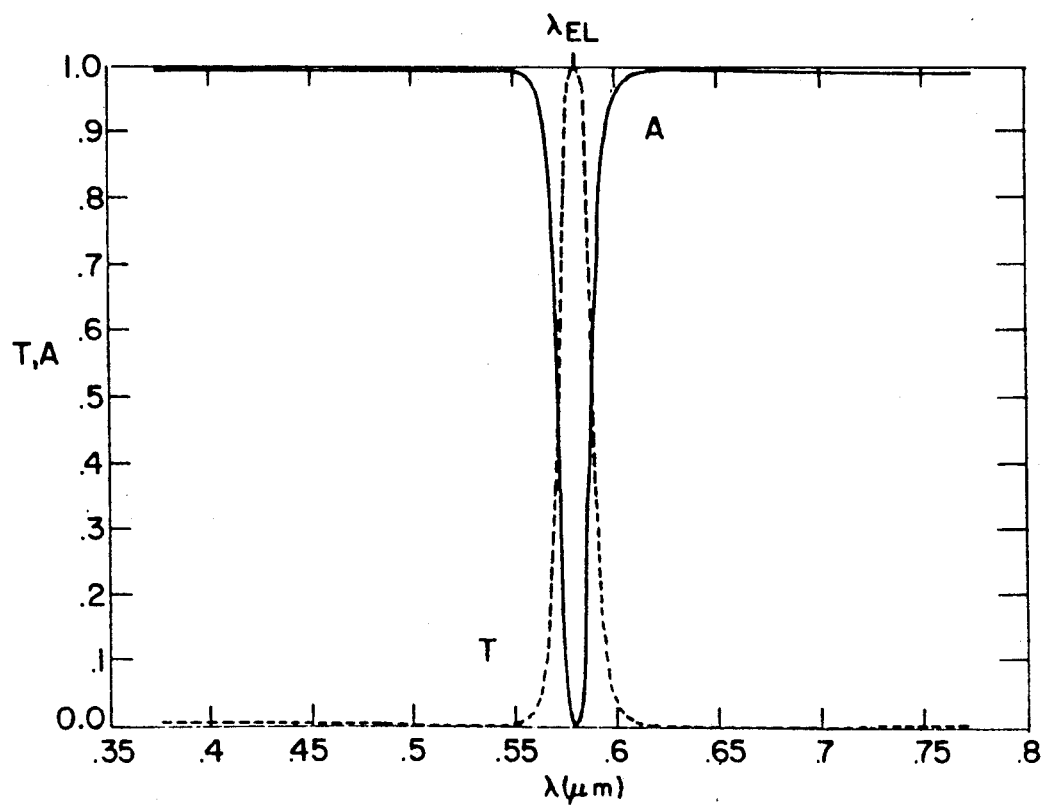
FIG. 4 is a graph of the spectral transmittance and absorptance of an optical interference electroluminescent device which behaves as a wideband absorber with narrowband transmission at the electroluminescence wavelengths.

The theoretical transmittance and absorptance of this embodiment according to the present invention is shown in FIG. 4, where the device behaves as a wideband absorber with narrowband transmission at an electroluminescent wavelength $\lambda_{EL}$. In FIG. 4, (———) designates the absorptance (A) of the device while (- - - -) designates the transmittance (T) through the electro-optical members 2, 10, 38, and 44 and the said at least one of the optical members 12, 14, 18 50 and 52 that are in front of the counter electrode electro-optical member 8.

In one specific example of this embodiment the optical member 12 comprises the following stack of nine films: Y$_2$O$_3$ (0.0973), Ag (0.0173), Y$_2$O$_3$ (0.2493), Ag (0.0095), ZrO$_2$ (0.0401), Inconel (0.0036), ZrO$_2$ (0.1448), Inconel (0.0025) and ZrO$_2$ (0.0705), the numbers within the brackets representing the thicknesses of the layers in μm, and Y$_2$O$_3$ and ZrO$_2$ are each a substantially transparent film 20, and Ag and Inconel are each a partially absorbing film 30 in the stack. The optical member 12 has an induced transmittance of 63% at $\lambda_{EL}=0.580$ μm, and a reduced luminous reflectance, when viewed by the observer, of 13%. It will be obvious to those practiced in the art that other, higher performance, optical members can be designed.

Figure 5:
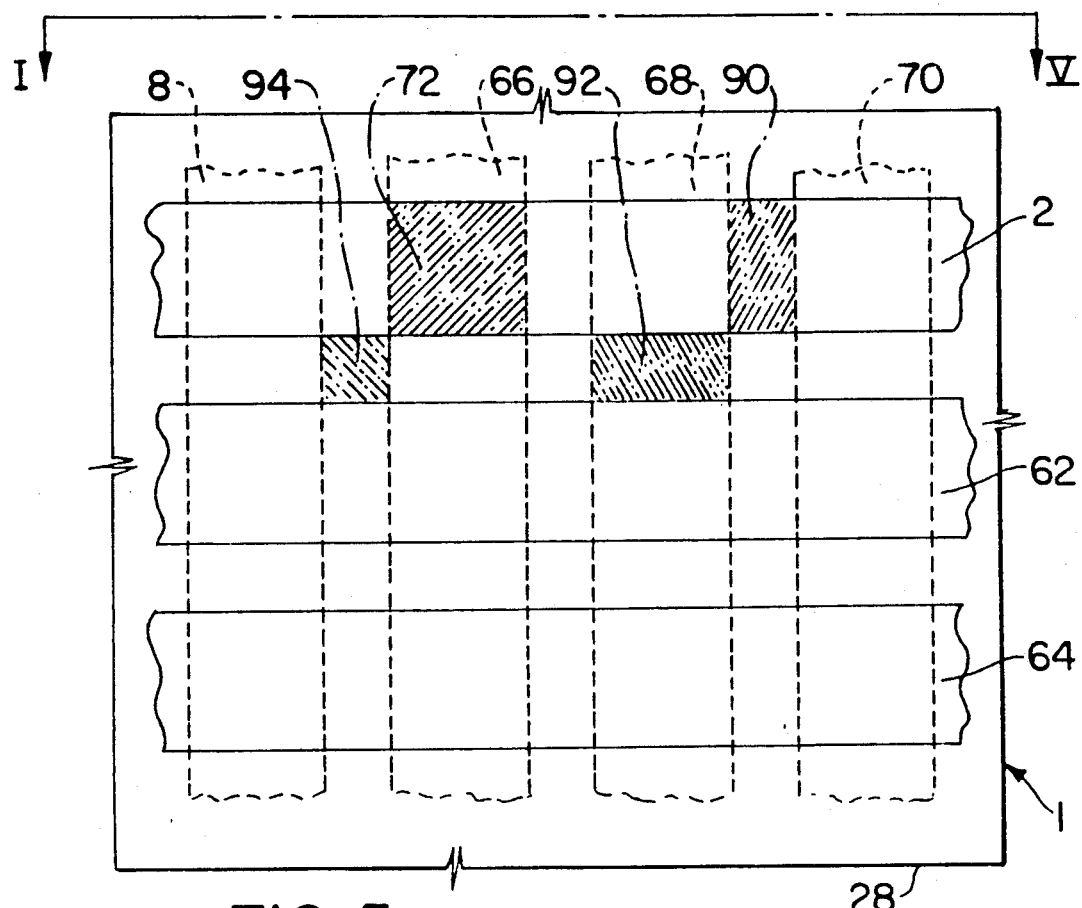
FIG. 5 is an enlarged, diagrammatic front view of a portion of an optical interference, electroluminescent display device having low reflectance.
Figure 6:
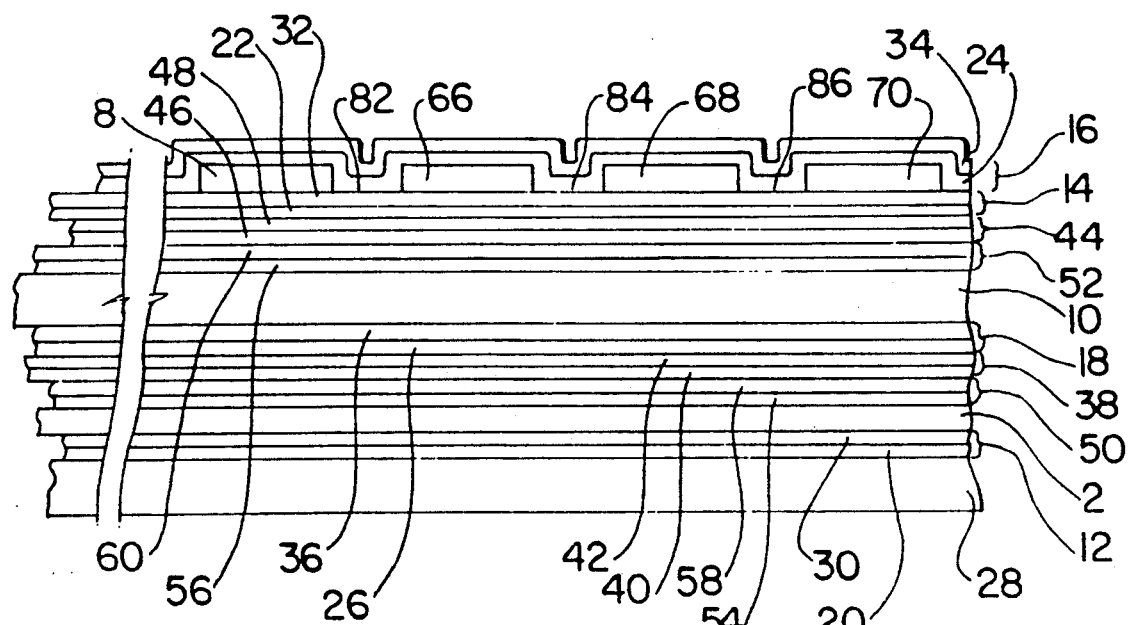
FIG. 6 is an side view along V—V, FIG. 5.

In FIGS. 5 and 6, similar parts to those shown in FIG. 1 are designated by the same reference numerals and the previous description is relied upon to describe them.

In FIGS. 5 and 6 the front electrode electro-optical members, three of which are shown and designated 2, 62 and 64, and the counter electrode electro-optical member 8 comprises one of a plurality of counter electrode electro-optical members four of which are shown and designated 8, 66, 68 and 70. The front electrode electro-optical members, such as 2, 62 and 64, overlie areas of the counter electrode electro-optical members, such as 8, 66, 68 and 70, to form a display depicting device 1.

It will be seen that in this embodiment of overlying electrodes, the front and counter electrode optical members, such as 2, 62 and 64, and 8, 66, 68 and 70, form the grid system of a pixel display device 1, with pixels such as pixel 72.

It should be noted that the films 20 and 30 of the optical member 12, if present, are first coated on the glass substrate, by, for example, vacuum deposition through a mask (not shown). The front electrode electro-optical members, such as 2, 62, and 64, are then simultaneously coated as layers 4 and 6 by, for example, vacuum deposition through a mask.

The optical members 14, 18, 50 and 52, and the electro-optical members 10, 38 and 44 are each then coated, sequentially in their correct order, over the front electrode electro-optical members, such as members 2, 62 and 64 by, for example, vacuum deposition through masks.

The counter electrode electro-optical members, such as 8, 66, 68 and 70, are then coated simultaneously through a mask by, for example, vacuum deposition on to the optical member 14, and then the optical member 16 is coated through a mask over the counter electrode electro-optical member such as 8, 66, 68 and 70 by, for example, vacuum deposition. Sequentially coating the electro-optical members and the optical members in this manner will cause the members to coat the rear face of the electrode manner on which they are deposited and the surfaces between them, such as the spaces 82, 84 and 86 (FIG. 6).

From this it will be apparent that there are four areas where different types of overlays are present in the device 1, and these are where, i) both of the electrode electro-optical members 2 and 8 are present, and these are pixels, such as pixel 72, ii) only the front electrode electro-optical member 2 is present, such as area 90, iii) only the counter electrode electro-optical member 8 is present, such as area 92, and iv) neither of the electrode electro-optical members 2 and 8 are present, such as area 94.

In some embodiments of the present invention, the thicknesses and materials of the films and layers at the four different types of areas, such as areas 72, 90, 92 and 94, are such that by the process of optical interference, different overlay areas of the device 1 have substantially the same reflectance and transmittance so that a substantially uniform appearance of the display is viewed when no electroluminescence is being emitted. The spectral reflectance of the pixels, such as area 72, can, for example, be reduced as previously described with reference to Table I, System c. It will be self-evident to persons skilled in the art that the reflectance of areas 90, 92, and 94 can be reduced in a similar manner to that described with reference to area 72.

We claim:

1. An optical interference, electroluminescent device having low reflectance, comprising:
   (a) an electroluminescence transmitting, electro-optical, front electrode, comprising at least one layer,
   (b) an electro-optical counter electrode, disposed to the rear of the front electrode and comprising at least one layer,
   (c) an electro-optical electroluminescent member, comprising at least one layer, and disposed between the front electrode and the counter electrode, and
   (d) at least one optical interference member disposed in said electroluminescent device such that at least an optical interference member is in interfacial contact with a front face of the counter electrode, the optical interference member comprising at least one optical interference film which is substantially transparent to ambient light and is of a thickness and material such that the spectral reflectance of said electroluminescent device is so modified that the reflectance of ambient light by the electroluminescent device towards a viewer is reduced.

2. A device according to claim 1, wherein the said at least one optical interference member comprises at least one further absorbing film which is partially absorbing and substantially transparent with respect to visible light such that the reflectance of ambient light by the electroluminescent device towards the viewer is further reduced by optical interference enhanced absorption.

3. A device according to claim 1, further comprising:
   (a) a first electro-optical, electroluminescence transmitting, dielectric member, comprising at least one layer, and being disposed between the front electrode and the electroluminescent member, and
   (b) a second electro-optical, electroluminescence transmitting, dielectric member, comprising at least one layer, and being disposed between the counter electrode and the electroluminescent member.

4. A device according to claim 2, further comprising:
   (a) a first electro-optical, electroluminescence transmitting, dielectric member, comprising at least one layer, and being disposed between the front electrode and the electroluminescent member, and
   (b) a second electro-optical, electroluminescence transmitting, dielectric member, comprising at least one layer, and being disposed between the counter electrode and the electroluminescent member.

5. A device according to claim 1, wherein the thicknesses and materials of the layers in said device are chosen to further reduce the reflectance of the device by optical interference.

6. A device according to claim 2, wherein,
   (a) the counter electrode has low reflectance and high transmittance at the wavelengths in which the electroluminescence is emitted,
   (b) a said optical interference member is in interfacial contact with a rear face of the counter electrode, and (c) the optical interference member of (b) is of such thicknesses and materials that, at the wavelengths at which the electroluminescense is emitted, the reflectance is high so as to increase the brightness of the device, while at other wavelengths the absorptance of light is high to reduce the reflectance of ambient light of the device towards the viewer at these other wavelengths.

7. A device according to claim 4, wherein,
(a) the counter electrode has low reflectance and high transmittance at the wavelengths in which the electroluminescence is emitted,
(b) a said optical interference member is in interfacial contact with a rear face of the counter electrode, and
(c) the optical interference member of b) is of such thicknesses and materials that, at the wavelengths at which the electroluminescence is emitted, the reflectance is high so as to increase the brightness of the device, while at other wavelengths the absorptance of light is high to reduce the reflectance of ambient light of the device towards the viewer at these other wavelengths.

8. A device according to claim 1, wherein the front and counter electrodes each comprise one of a plurality of electrodes, with the front electrode partially overlying areas of the counter electrode to form a display depicting device.

9. A device according to claim 2, wherein the front and counter electrodes each comprise one of a plurality of electrodes, with the front electrode partially overlying areas of the counter electrode to form a display depicting device.

10. A device according to claim 3, wherein the front and counter electrodes each comprise one of a plurality of electrodes, with the front electrode partially overlying areas of the counter electrode to form a display depicting device.

11. A device according to claim 8, wherein the front and counter electrodes form a grid system of a pixel display depicting device.

12. A device according to claim 9, wherein the front and counter electrodes form a grid system of a pixel display depicting device.

13. A device according to claim 10, wherein the front and counter electrodes form a grid system of a pixel display depicting device.

14. A device according to claim 1, wherein the optical interference film has an optical thickness of at least about 0.035 $\mu$m with an extinction coefficient such that at least about 90% of the incident light as transmitted per se at a predetermined wavelength.

15. A device according to claim 2, wherein the further absorbing optical film has a transmittance of at least about 35% at a predetermined wavelength.

* * * * *